United States Patent [19]

Shiraki

[11] Patent Number: 5,498,877
[45] Date of Patent: Mar. 12, 1996

[54] METHOD OF MANUFACTURING SEMICONDUCTOR DEVICE USING MEASUREMENT MARK PATTERN

[75] Inventor: Seiichi Shiraki, Tokyo, Japan

[73] Assignee: NEC Corporation, Tokyo, Japan

[21] Appl. No.: 351,174

[22] Filed: Nov. 30, 1994

[30] Foreign Application Priority Data

Nov. 30, 1993 [JP] Japan ................... 5-323335

[51] Int. Cl.$^6$ ................................................. H01J 37/00
[52] U.S. Cl. ................................. 250/491.1; 250/397
[58] Field of Search ................................. 250/397, 398, 250/492.2, 491.1

[56] References Cited

U.S. PATENT DOCUMENTS

| | | | |
|---|---|---|---|
| 4,370,554 | 1/1983 | Bohlen et al. ................ | 250/491.1 |
| 4,908,656 | 3/1990 | Suwa et al. ................... | 355/53 |
| 5,172,331 | 12/1992 | Yamada ........................ | 250/492.2 |
| 5,276,337 | 1/1994 | Starikov ....................... | 250/548 |
| 5,393,988 | 2/1995 | Sakamoto ..................... | 250/492.22 |
| 5,422,491 | 6/1995 | Sakamoto ..................... | 250/492.22 |

*Primary Examiner*—Bruce C. Anderson
*Attorney, Agent, or Firm*—Popham, Haik, Schnobrich & Kaufman, Ltd.

[57] ABSTRACT

A method of manufacturing a semiconductor device, includes the steps of forming a measurement mark of a lower layer on a semiconductor substrate in a photolithography process, forming a measurement mark of an upper layer to be superposed on the measurement mark of the lower layer in the photolithography process, measuring relative sizes between the measurement marks of lower and upper layers in X and Y directions on a plane, and calculating a relative alignment error size between the measurement marks and an error size of the measurement mark with respect to a reference value on the basis of the measured value, wherein a result of the photolithography process is determined on the basis of the calculated error sizes.

5 Claims, 4 Drawing Sheets

METHOD OF MANUFACTURING SEMICONDUCTOR DEVICE USING MEASUREMENT MARK PATTERN

BACKGROUND OF THE INVENTION

1. Field of the Invention

The present invention relates to a method of manufacturing a semiconductor device using a photolithography technique and, more particularly, to a method of manufacturing a semiconductor device using a measurement mark pattern.

2. Description of the Related Art

In the manufacturing process of a semiconductor device, various pattern films, opening portions, and the like are formed using a photolithography technique. When a pattern or opening portion is to be formed in an upper layer, the pattern or opening portion must be relatively aligned with the pattern of a lower layer. For example, in formation of a contact for electrically connecting the upper and lower wiring layers with each other, if this contact is misaligned, the contact is formed in the wiring layer or layers. In formation of the source/drain of a MOS transistor, if a mask film as an upper layer is misaligned, an impurity may be injected in a region, deviated from an expected region, of a lower layer, resulting in a defective device.

In addition, the electrical characteristics of a MOS transistor or other devices of this type, e.g., various specifications such as an operation speed, a capacitance, and a threshold voltage are often determined by the two-dimensional size of a structure formed on a semiconductor substrate. If a size error is caused due to the above-described misalignment or upon exposure, desired characteristics cannot be obtained in some cases. Therefore, size measurement need to be performed in formation of each pattern.

Conventionally, alignment marks are formed on lower and upper layers. A superposition error between these alignment marks is measured, thereby performing the above-described alignment. As for a to-be-formed layer, a size measurement mark is formed, and after exposure, the size of the developed size measurement mark is measured, thereby detecting a size error.

In this case, in the former measurement of an alignment error, alignment marks each having a size of about several μm or more are formed. Each alignment mark is visually read by using a microscope, and a misalignment between the alignment marks of the upper and lower layers is measured, thereby measuring an alignment error. Alternatively, the alignment mark is detected using an optical system. The obtained image is converted into an electrical signal, and a predetermined process is performed, thereby measuring an alignment error.

In the latter measurement of a size error, a size measurement mark having almost the same size (1 μm or less) as that of the element pattern of a device is formed. An electron beam is scanned on the measurement mark, and secondary electrons emitted thereupon are detected. A size is calculated in accordance with the intensity waveform of the secondary electrons.

For this reason, in the conventional manufacturing process, measurement of an alignment error and measurement of a size error must be performed by different apparatuses, and it is difficult to simultaneously perform these measurements. In addition, since the processing method for detecting the alignment marks is different from that for the size measurement mark, and precisions required for the two detection processes are largely different, it is not preferable to perform these measurements using the same mark. For example, if an alignment mark having a size of several μm is used for measurement of a size, a very small size error cannot be measured. To the contrary, if a size measurement mark having a size of 1 μm or less is used for measurement of an alignment error, size and alignment errors of such a small mark cannot be measured because of the limited precision of the apparatus. As described above, it is conventionally difficult to simultaneously perform measurement of a size error and measurement of an alignment error. As a result, these measurements must be independently performed.

Therefore, in the conventional photolithography process, as shown in the flow chart of FIG. 1, test exposure (pilot exposure) is performed for one or several semiconductor substrates. Alignment between an alignment mark of a lower layer and an alignment mark of an upper layer is determined by an operator or using an apparatus, and an alignment error is measured and fed back. Thereafter, all the remaining semiconductor substrates are exposed. A size error is measured for each exposed substrate using a size measurement mark after development of a photoresist. If any substrate is determined to fall outside a specified range, the photoresist process from coating is repeated. As for a substrate falling inside the specified range, an alignment error is measured again. If the substrate is determined to fall outside the specified range, the photoresist process from coating is performed again.

For this reason, conventionally, some substrates having size errors within a specified range may be determined as defective upon measurement of an alignment error, so the manufacturing efficiency of semiconductor devices becomes low. To the contrary, when measurement of a size error is performed after measurement of an alignment error, some substrates having alignment errors within a specified range are determined as defective upon measurement of the size error. This also results in a low manufacturing efficiency of semiconductor devices.

SUMMARY OF THE INVENTION

The present invention has been made in consideration of the above situation, and has as its object to provide a method of manufacturing a semiconductor device, which uses a measurement mark pattern capable of improving the manufacturing efficiency of semiconductor devices, thereby preventing the manufacture of a defective semiconductor.

In order to achieve the above object, according to the first aspect of the present invention, there is provided a method of manufacturing a semiconductor device, comprising the steps of forming a measurement mark of a lower layer on a semiconductor substrate by a photolithography process, forming a measurement mark of an upper layer to be superposed on the measurement mark of the lower layer by the photolithography process, measuring relative sizes between the measurement marks of the lower and upper layers in X and Y directions on a plane, and calculating relative alignment error sizes between the measurement marks and an error size of the measurement mark with respect to a reference values on the basis of the measured values, wherein a result of the photolithography process is determined on the basis of the calculated error sizes.

The relative sizes between the two measurement marks in the X and Y directions, which are described in the first aspect, are calculated as follows. An electron beam scans the measurement marks of the lower and upper layers in the X and Y directions on the plane, and reflection signals are detected. The relative sizes are calculated on the basis of the detection values.

According to the second aspect of the present invention, there is also provided a method of manufacturing a semiconductor device, comprising the steps of performing a photolithography process as in the first aspect for one or a few of a plurality of to-be-manufactured semiconductor substrates, performing measurement of an alignment error and measurement of a size error by using obtained measurement marks of lower and upper layers, performing the photolithography process for all of the semiconductor substrates in a condition corrected on the basis of the obtained measurement values, and simultaneously performing measurement of the alignment error and measurement of the size error for all of the semiconductor substrates by using the measurement marks of the lower and upper layers to determine a result.

Out of the measurement marks of the upper and lower layers used in the first and second aspects, one is formed as a pattern having a size of 0.2 to 4 μm, and the other is formed as a pattern having a size of 0.1 to 2 μm.

For example, one measurement mark is formed into a rectangle having a side of 0.2 to 4 μm, and the other measurement mark is formed into a similar rectangle having a side of 0.1 to 2 μm.

As is apparent from the above aspects, according to the present invention, the relative sizes between the measurement marks of the lower and upper layers in the X and Y directions on the plane are measured. The relative alignment error sizes between the two measurement marks and the error size of the mark with respect to the reference value are calculated on the basis of the measured values. For this reason, the result of alignment and size in the photolithography process can be simultaneously determined on the basis of the calculated error sizes, thereby simplifying the manufacturing process.

Especially, the photolithography process is performed for one or a few of the plurality of to-be-manufactured semiconductor substrates in a single condition. The photolithography process is performed for all the semiconductor substrates in a condition corrected on the basis of the measurement values of the alignment error and the size error, which are obtained in the first photolithography process. Thereafter, measurement of the alignment error and measurement of the size error are simultaneously performed for all the semiconductor substrates. Therefore, a defective semiconductor device is prevented from being manufactured, and at the same time, a simpler and higher-speed error measurement process can be achieved.

In addition, one measurement mark is formed as a pattern having a size of 0.2 to 4 μm, and the other measurement mark is formed as a pattern having a size of 0.1 to 2 μm. When relative sizes between these marks are detected using an electron beam, measurement of an alignment error size between the measurement marks and measurement of a size error in the photolithography process for formation of the measurement marks can be simultaneously performed. For this reason, the number of manufacturing steps can be decreased.

The above and other advantages, features and additional objects of the present invention will become manifest to those versed in the art upon making reference to the following detailed description and accompanying drawings in which preferred embodiments incorporating the principle of the present invention are shown by way of illustrative example.

DETAILED DESCRIPTION OF THE PREFERRED EMBODIMENTS

Figure 1:
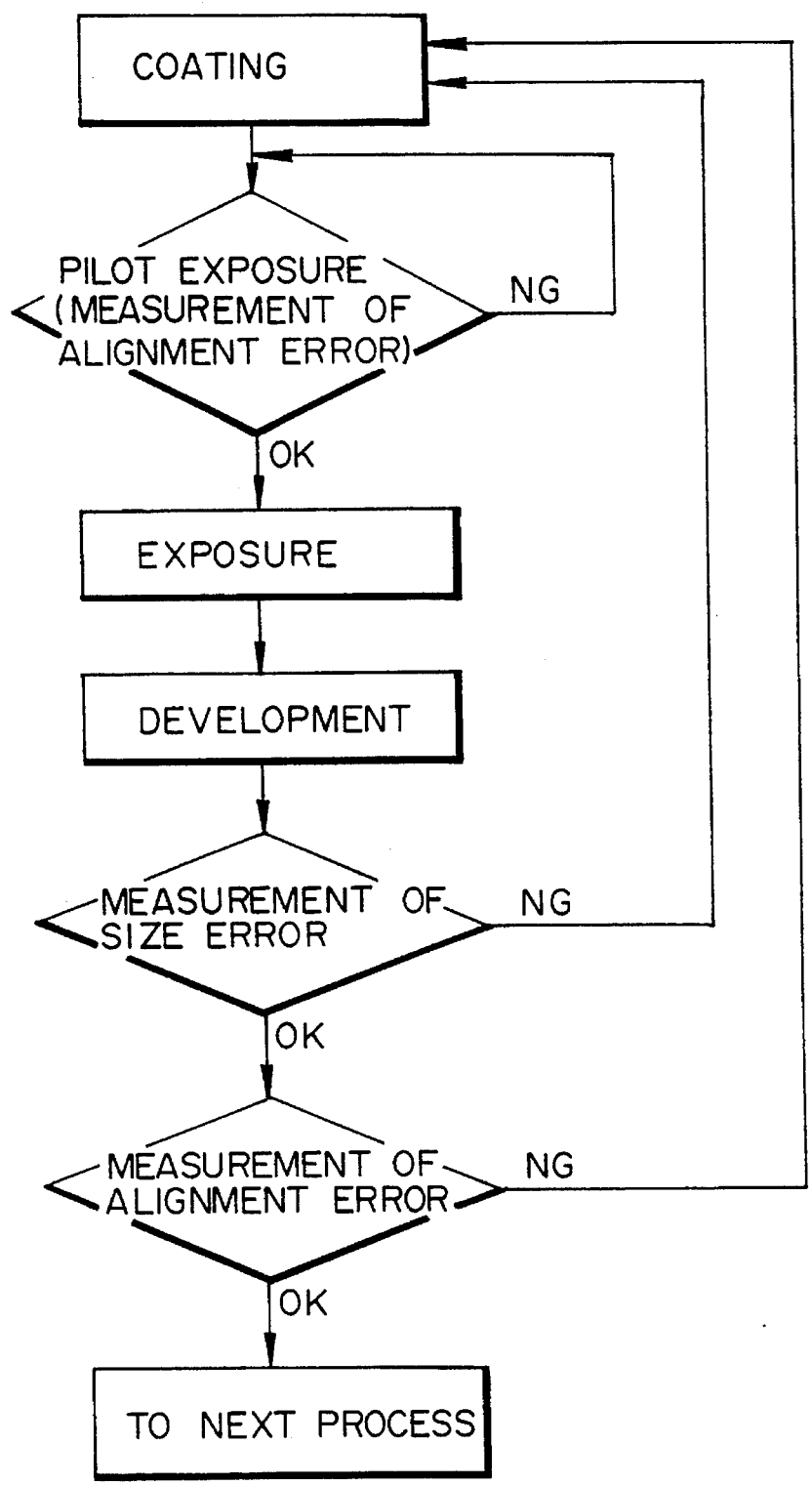
FIG. 1 is a flow chart showing steps so as to explain a conventional method of manufacturing a semiconductor device.
Figure 2A:
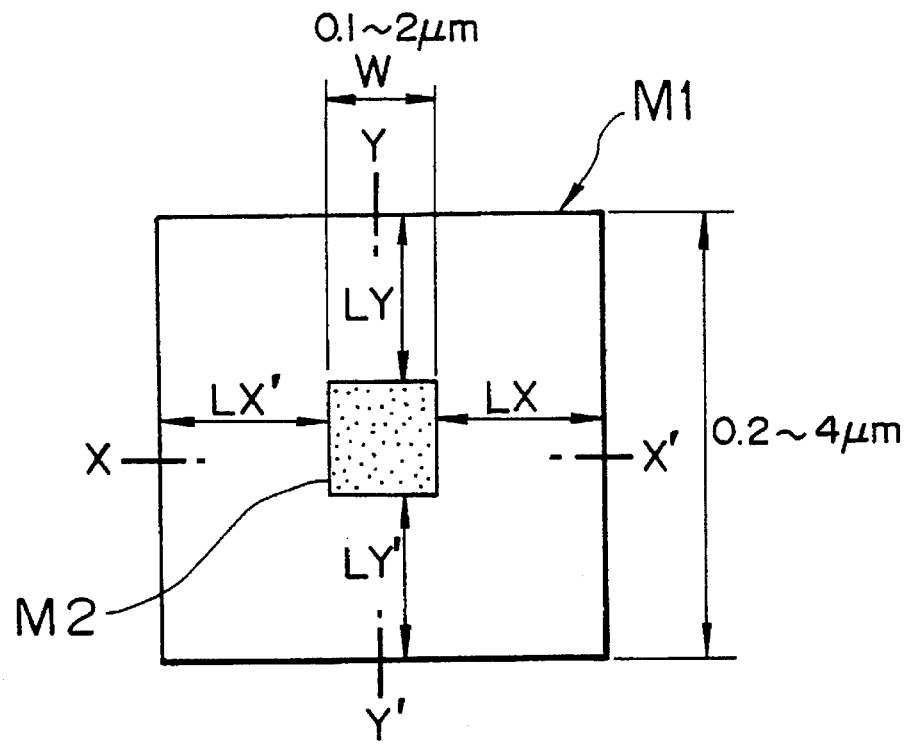
FIGS. 2A and 2B are a plan view showing a measurement mark pattern in the first embodiment of the present invention and a view showing the intensity waveform of secondary electrons obtained when an electron beam scans the measurement pattern, respectively.

The present invention will be described below with reference to the accompanying drawings. FIG. 2A shows a measurement mark pattern of the first embodiment of the present invention. Referring to FIG. 2A, a measurement mark M1 of a lower layer is formed into a small square or rectangle having a side of 0.2 to 4 μm. A measurement mark M2 of an upper layer is formed into a square or rectangle having a side of 0.1 to 2 μm, which is smaller than the measurement mark M1 of the lower layer. In this case, the measurement marks M1 and M2 preferably have similar shapes of the lower and upper layers.

When an alignment error and a size error are to be measured using the measurement marks M1 and M2, an electron beam is scanned along lines X–X' and Y–Y' in FIG. 2A. Secondary electrons emitted upon scanning are detected, and a superposition error and a size error are measured using the same pattern in accordance with the intensity waveform of the secondary electrons.

Figure 2B:
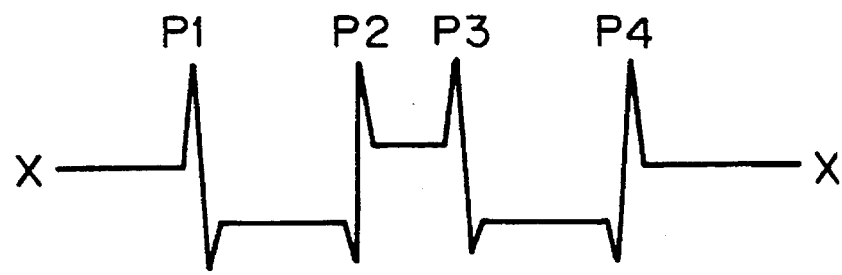

FIG. 2B shows the intensity waveform of the secondary electrons obtained when the electron beam scans the measurement marks M1 and M2 in the direction X–X'. In this case, when a size LX between peaks P1 and P2 and a size LX' between peaks P3 and P4 are measured, a misalignment size $\Delta X$ in the direction X is calculated as $\Delta = LX - LX')/2$. Similarly, the electron beam scanned in the direction Y–Y', and a misalignment size $\Delta Y$ in the direction Y is calculated as $\Delta Y = (LY - LY')/2$. In addition, a size W between the peaks P2 and P3 is compared with a reference size to calculate a difference or ratio, thereby obtaining a size error $\delta L$.

To calculate these misalignment sizes $\Delta X$ and $\Delta Y$ and the size error $\delta L$, a threshold method, a linear approximation method, or the like using the intensity waveform of the secondary electrons may be used. If two or more measurement values are present in the same direction, an average value may be employed. As described above, measurement of an alignment error and measurement of a size can be simultaneously performed upon scanning of the electron beam on the same pattern.

Figure 3:
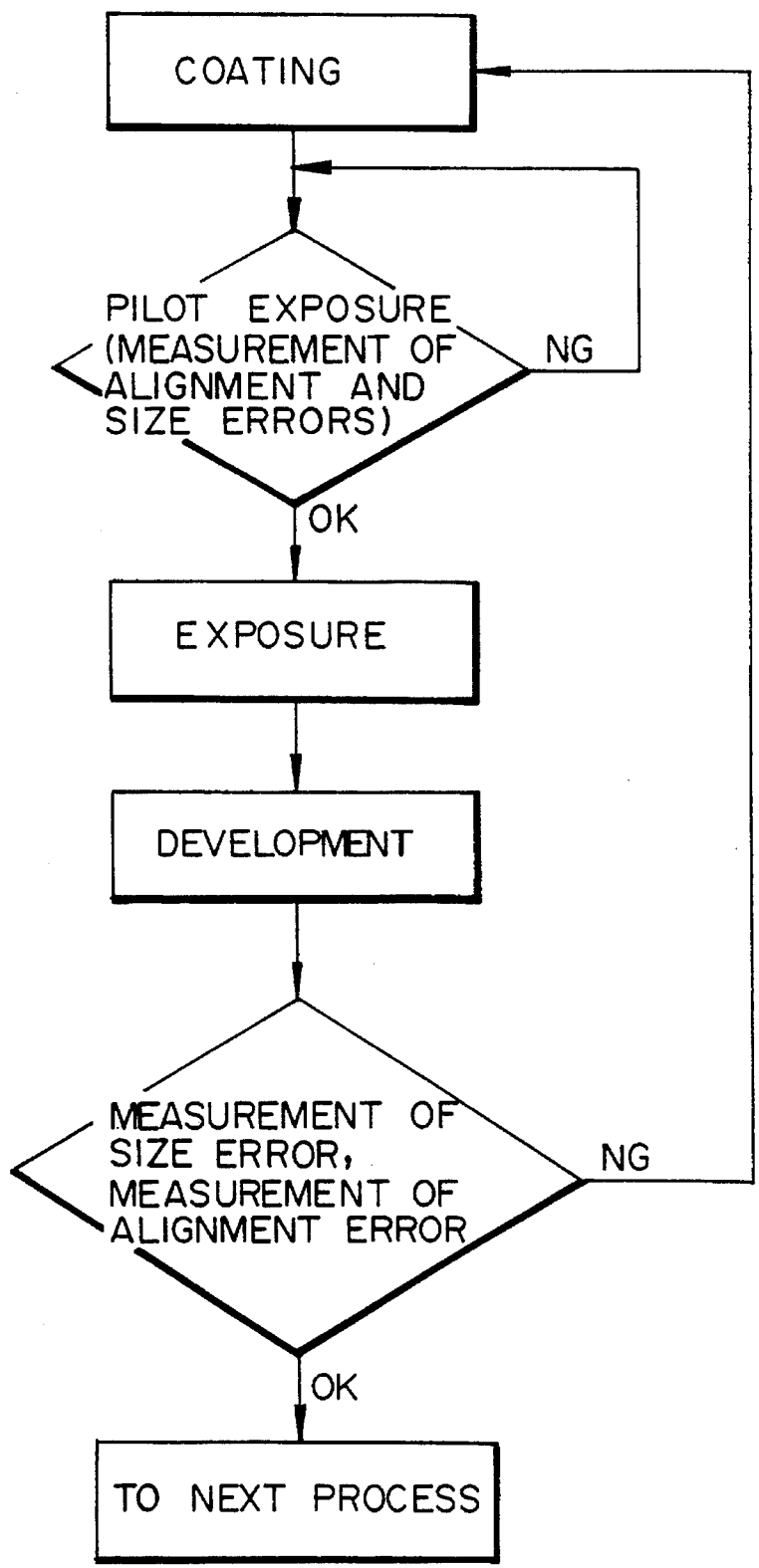
FIG. 3 is a flow chart showing steps so as to explain a method of manufacturing a semiconductor device of the present invention.

For this reason, in the present invention, as shown in the flow chart of FIG. 3, test exposure (pilot exposure) is performed for one or several semiconductor substrates. The above-described measurement of an alignment error and measurement of a size error are performed using measurement marks of lower and upper layers, and the measurement result is fed back. Thereafter, all the remaining semiconductor substrates are exposed. As for all the exposed substrates, an alignment error and a size error are measured by using the measurement marks after development of a photoresist. If a substrate is determined to fall outside a specified range, the photoresist process from coating is repeatedly performed. At this time, all substrates falling inside the specified range are determined as non-defective.

Therefore, alignment and size errors can be simultaneously measured in one step. Substrates having non-specified sizes are removed upon this measurement, so measurement need not be repeatedly performed. Additionally, only one more photolithography process need be performed for substrates falling outside a specified range. For this reason, the efficiency of the photolithography process can be improved as a whole.

Figure 4:
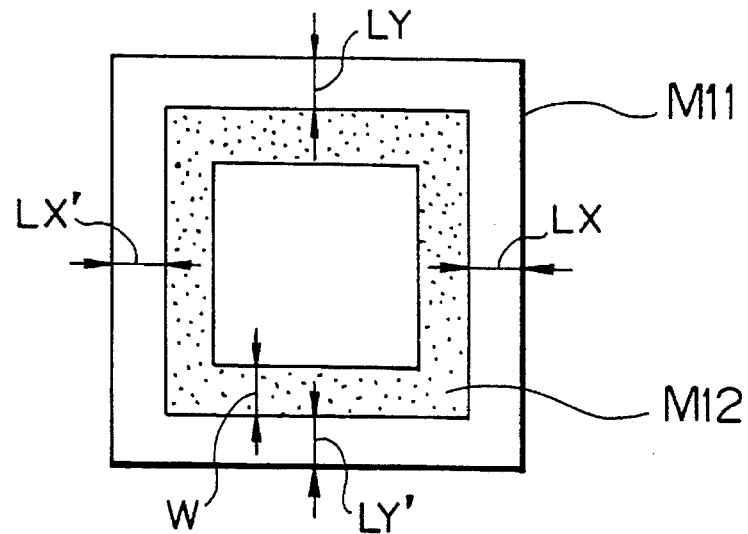
FIG. 4 is a plan view showing a measurement mark pattern in the second embodiment of the present invention.

FIG. 4 shows a measurement mark pattern of the second embodiment of the present invention. In this embodiment, a measurement mark M11 of a lower layer is formed into a rectangle as in the first embodiment. A measurement mark M12 of an upper layer is formed into a rectangular frame-like shape along the inner edge of the measurement mark of the lower layer. Also in this case, the measurement mark M11 of the lower layer has a size of 0.2 to 4 µm, and the width of the measurement mark M12 of the upper layer is set to 0.1 to 2 µm. An electron beam is scanned on the measurement marks M11 and M12 in directions X–X' and Y–Y'. An alignment error and a size error are calculated from the obtained data. The same portions as in the first embodiment have corresponding sizes.

Figure 5:
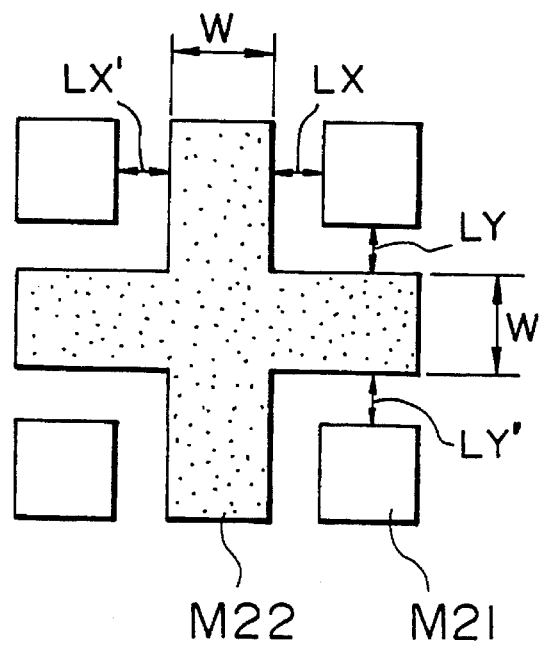
FIG. 5 is a plan view showing a measurement mark pattern in the third embodiment of the present invention.

FIG. 5 shows a measurement mark pattern of the third embodiment. In this embodiment, four measurement marks M21 of a lower layer are formed into small-sized rectangles arranged to be separated from each other by appropriate intervals. A measurement mark M22 of an upper layer is formed into a cross extending among the measurement marks M21 of the lower layer. In this case, the interval among the measurement marks M21 of the lower layer is set to 0.2 to 4 µm. The width of the measurement mark M22 of the upper layer is set to 0.1 to 2 µm.

An electron beam is scanned on the measurement marks M21 and M22 in directions X–X' and Y–Y', and an alignment error and a size error are calculated from the obtained data, as in the above embodiments. In this embodiment, a plurality of size measurement values are present in the longitudinal and lateral directions. Therefore, if an average value among these measurement values is used as an alignment error value or a size error value, a more accurate measurement value can be obtained. Additionally, in this embodiment, a deviation (rotation) in the rotational direction, which is generated upon superposition, can also be measured.

The above-described measurement marks are typical examples of the present invention, and various mark patterns can be formed. In addition, the size of each measurement mark is appropriately set within the above-described range in accordance with the pattern size of a to-be-formed device or the measurement precision of a measuring apparatus.

What is claimed is:

1. A method of manufacturing a semiconductor device, comprising the steps of forming a measurement mark of a lower layer on a semiconductor substrate by a photolithography process, forming a measurement mark of an upper layer to be superposed on said measurement mark of the lower layer by the photolithography process, measuring relative sizes between said measurement marks of the lower and upper layers in X and Y directions on a plane, and calculating relative alignment error between said measurement marks and a size error of said measurement mark with respect to a reference value on the basis of the measured values, wherein a result of the photolithography process is determined on the basis of the calculated error sizes.

2. A method according to claim 1, wherein an electron beam scans said measurement marks of the lower and upper layers in the X and Y directions on said plane, and reflection signals are detected to measure the relative errors between said measurement marks in the X and Y directions on said plane.

3. A method of manufacturing a semiconductor device, comprising the steps of performing a photolithography process as in claim 1 for one or a few of a plurality of to-be-manufactured semiconductor substrates, performing measurement of an alignment error and measurement of a size error by using obtained measurement marks of the lower and upper layers, performing the photolithography process for all of said semiconductor substrates in a condition corrected on the basis of the obtained measurement values, and simultaneously performing measurement of the alignment error and measurement of the size error for all of said semiconductor substrates by using said measurement marks of the lower and upper layers to determine a result.

4. A method according to claim 1, wherein one of said measurement marks of the lower and upper layers is formed as a pattern having a size of 0.2 to 4 µm, and the other measurement mark is formed as a pattern having a size of 0.1 to 2 µm.

5. A method according to claim 4, wherein said one measurement mark is formed into a rectangle having a side of 0.2 to 4 µm, and said other measurement mark is formed into a similar rectangle having a side of 0.1 to 2 µm.

* * * * *